United States Patent [19]

Schlösser

[11] Patent Number: 4,484,291
[45] Date of Patent: Nov. 20, 1984

[54] COMPARISON CIRCUIT FOR DETERMINING THE STATISTICAL EQUALITY OF TWO ANALOG SIGNALS

[75] Inventor: Theodoor A. J. Schlösser, Eindhoven, Netherlands

[73] Assignee: U.S. Philips Corporation, New York, N.Y.

[21] Appl. No.: 313,393

[22] Filed: Oct. 21, 1981

[30] Foreign Application Priority Data

Nov. 21, 1980 [NL] Netherlands .................. 8006353

[51] Int. Cl.³ .................. G06J 1/00; H03J 7/18
[52] U.S. Cl. .................. 364/484; 328/133; 324/78 Z
[58] Field of Search ... 364/200 MS File, 900 MS File, 364/484, 728; 328/133, 134; 324/78 D, 78 Z

[56] References Cited

U.S. PATENT DOCUMENTS

| | | | |
|---|---|---|---|
| 3,882,303 | 5/1975 | Linder | 324/78 Z |
| 3,924,183 | 12/1975 | Fletcher | 328/134 |
| 3,993,984 | 11/1976 | Penrod | 328/134 |
| 4,150,432 | 4/1979 | Sorden | 364/484 |

Primary Examiner—David H. Malzahn
Attorney, Agent, or Firm—Thomas A. Briody; William J. Streeter; Charles E. Quarton

[57] ABSTRACT

Signal comparison arrangement for comparing a first and a second analog signal with each other. For each of these signals the number of zero-crossings occurring within each measuring interval of a sequence of N consecutive measuring intervals $T(1)$, $T(2)$, ... $T(N)$ is counted. The N numbers $x(1)$, $x(2)$, ... $x(N)$ which represent the numbers of zero-crossings of the first analog signal in the consecutive measuring intervals $T(1)$, $T(2)$, ... $T(N)$ and the N numbers $y(1)$, $y(2)$, ... $y(N)$ which represent these numbers of zero-crossings of the second analog signal in the said measuring intervals, are applied to a programmable computer which determines the value of a statistical quantity by means of these 2N numbers and compares this value with a threshold value. This statistical quantity may be formed by the directional coefficient of a straight line which is closest to either the N numbers $x(n)$, or the N numbers $y(n)$, but may alternatively be formed by the correlation coefficient.

4 Claims, 2 Drawing Figures

COMPARISON CIRCUIT FOR DETERMINING THE STATISTICAL EQUALITY OF TWO ANALOG SIGNALS

BACKGROUND OF THE INVENTION

1. Field of the Invention

The invention relates to a comparison circuit for comparing two signals with each other and to ascertain whether these signals are equal to each other. This comparison circuit is particularly intended for use in a car radio receiver.

2. Description of the Prior Art

As is generally known a car receiver includes a tunable receiving circuit. By applying a predetermined tuning datum to this receiving circuit it is tuned to a predetermined radio channel through which a certain program is transmitted. Modern car radios often comprise a memory in which the tuning data for a number of radio channels are stored. Such a tuning datum can then be selected by means of a selection switch and applied to the receiving circuit.

Reference 1 discloses a car receiver in which the memory consists of a plurality of addressable memory fields each having a plurality of addressable memory locations. A tuning datum is stored in each memory location and a memory field contains more in particular the tuning data for, for example, all those radio channels through which the same program is transmitted. One of these memory fields can be selected by means of the selection switch. A search tuning circuit has been provided for selecting one of the tuning data stored in this selected memory field. This search tuning circuit has a search-mode and a rest-mode. If it is adjusted to the search-mode, the tuning datum which corresponds to the radio channel whose received field strength is strongest is selected from the tuning data stored in the relevant memory field. After the receiving circuit has been tuned to this radio channel the search tuning circuit is automatically adjusted to the rest-mode. The search tuning circuit is automatically adjusted to the search mode again when the selection switch is operated, but also when the received field strength of the radio channel to which the receiving circuit has been tuned decreases to below a predetermined value.

This prior art car radio receiver has the disadvantage that all tuning data must be previously fed manually into the different memory locations. The consequence thereof is, for example, that if the receiving circuit must be tuned manually to a radio channel the tuning datum of which has not been previously stored in one of the memory fields and the received field strength of this radio channel decreases to below a desired value that then this receiving circuit must be readjusted manually.

To obviate the two above-mentioned disadvantages, reference 2 proposed to tune the receiving circuit (for example manually) to a radio-channel through which a desired program is transmitted and to search thereafter, for example by means of an auxiliary receiving circuit to which a search tuning circuit is connected, for all those radio channels through which the same program is transmitted and to store the tuning data obtained therefrom in a memory field. In order to ascertain whether the desired program is also transmitted through that radio channel to which the auxiliary receiving circuit has been tuned by the search tuning circuit, the output signals of the two receiving circuits are compared with each other in a comparison circuit. This comparison circuit produces a first output signal when the two signals are equal to each other. If they are not equal, the comparison circuit produces a second output signal. In response to the first output signal the tuning datum which was used to tune the auxiliary receiving circuit to the relevant radio channel is stored in a memory location of a memory field.

SUMMARY OF THE INVENTION

The invention has for its object to provide an advantageous embodiment of such a comparison circuit for mutually comparing a first and a second analog signal. According to the invention, this comparison circuit comprises:

a. a first and a second signal processing channel each having:
  i—an input to which the first and the second analog signal, respectively, are applied;
  ii—an output;
  iii—a zero-crossing detector the input of which is coupled to the input of the signal processing channel;
  iv—a counter circuit the input of which is connected to the output of the zero-crossing detector and the output of which is coupled to the output of the signal processing channel and which is arranged to count all zero-crossings occurring within a measuring time interval $T(n)$ wherein $n = 1, 2, 3, \ldots N$ of a number of N measuring time intervals $T(1), T(2), \ldots T(N)$ and for producing a number which indicates the number of zero-crossings which occur in this measuring time interval $T(n)$.

b. a computer which is coupled to the two outputs of the two signal processing channels and is arranged to:
  i—receive the N numbers produced by the counter circuit in the first signal processing channel and the N numbers produced by the counter circuit in the second signal processing channel;
  ii—determine by means of these numbers the value of a statistical quantity;
  iii—produce a first and a second signal, respectively, when the value of this statistical quantity is higher than, respectively lower than or equal to a threshold value.

If now at a predetermined instant the first signal is produced by the computer this means, for example, that there is little or no correlation between the two analog signals and that they have little or no agreement. If, in contrast therewith, the second signal is produced this means that the two analog signals are highly correlated and are consequently accurately in agreement.

Hereafter the number of zero-crossings of the first signal in the measuring time interval $T(n)$ will be denoted by $x(n)$ and the number of zero-crossings of the second signal in the same measuring time interval $T(n)$ will be denoted by $y(n)$, it holding that $n = 1, 2, 3, \ldots N$.

Although the numbers $x(n)$ and $y(n)$ are independent from each other it is yet possible to determine a statistical quantity in a particularly simple way, namely if the N numbers $y(n)$ are assumed to be linearly related to the N numbers $x(n)$. Considering the numbers $x(n)$ to be independent variables, a straight line can be defined which has the general form $y = a_1 x + b_1$ and which is closest to the N numbers $y(n)$. The statistical quantity to be computed is now formed by the directional coefficient $a_1$, which can be computed in known manner by using the least square error method (alternatively designated linearly regression method). Preferably, a programmable computer which has been provided with or can be provided with the necessary memories to store the N numbers $x(n)$ and the N numbers $y(n)$ is chosen for this computation.

In addition to the above-mentioned directional coefficient $a_1$ it is also possible to determine the directional coefficient $a_2$ of a straight line of the general form $x = a_2y + b_2$ and which is closest to the N numbers $x(n)$. In that case the numbers $y(n)$ are considered to be the independent variables. Also this directional coefficient $a_2$ can be computed by means of the least square error method.

A further statistical quantity which can be determined by the computer by means of the N numbers $x(n)$ and the N numbers $y(n)$ is the what is commonly known as correlation coefficient R. This correlation coefficient may be assumed to be equal either to the product $a_1a_2$ of the two directional coefficients or to the square root of this product.

value and at which a logic "1" appears when the computed correlation coefficient R exceeds this threshold value.

As is generally known, the directional coefficients $a_1$ and $a_2$ defined in paragraph B follow from the respective expressions:

$$a_1 = \frac{\sum_{n=1}^{N} x(n)y(n) - \frac{1}{N} \sum_{n=1}^{N} x(n) \sum_{n=1}^{N} y(n)}{\sum_{n=1}^{N} \{x(n)\}^2 - \frac{1}{N}\left(\sum_{n=1}^{N} x(n)\right)^2} \quad (1)$$

$$a_2 = \frac{\sum_{n=1}^{N} x(n)y(n) - \frac{1}{N} \sum_{n=1}^{N} x(n) \sum_{n=1}^{N} y(n)}{\sum_{n=1}^{N} \{y(n)\}^2 - \frac{1}{N}\left(\sum_{n=1}^{N} y(n)\right)^2} \quad (2)$$

If now the correlation coefficient R is defined as the product of the two directional coefficients $a_1$ and $a_2$, then it follows from the expressions (1) and (2) that:

$$R = \frac{\left[\sum_{n=1}^{N} x(n)y(n) - \frac{1}{N} \sum_{n=1}^{N} x(n) \sum_{n=1}^{N} y(n)\right]^2}{\left[\sum_{n=1}^{N} \{x(n)\}^2 - \frac{1}{N}\left(\sum_{n=1}^{N} x(n)\right)^2\right] \cdot \left[\sum_{n=1}^{N} \{y(n)\}^2 - \frac{1}{N}\left(\sum_{n=1}^{N} y(n)\right)^2\right]} \quad (3)$$

References

1. Receiver including a tuning circuit having a transmitter search device; Netherlands Patent Application No. 7413161; counterpart to U.S. Pat. No. 4,253,194 issued Feb. 24, 1981;

2. Verfahren und Schaltungsanordnung für einen Rundfunkempfänger mit Sendersuchlauf; German Patent Application No. 29 46 755.8; available to the public on June 4, 1981 and counterpart to United Kingdom Patent No. 2,065,422.

SHORT DESCRIPTION OF THE FIGURE

DESCRIPTION OF THE EMBODIMENTS

Figure 1:
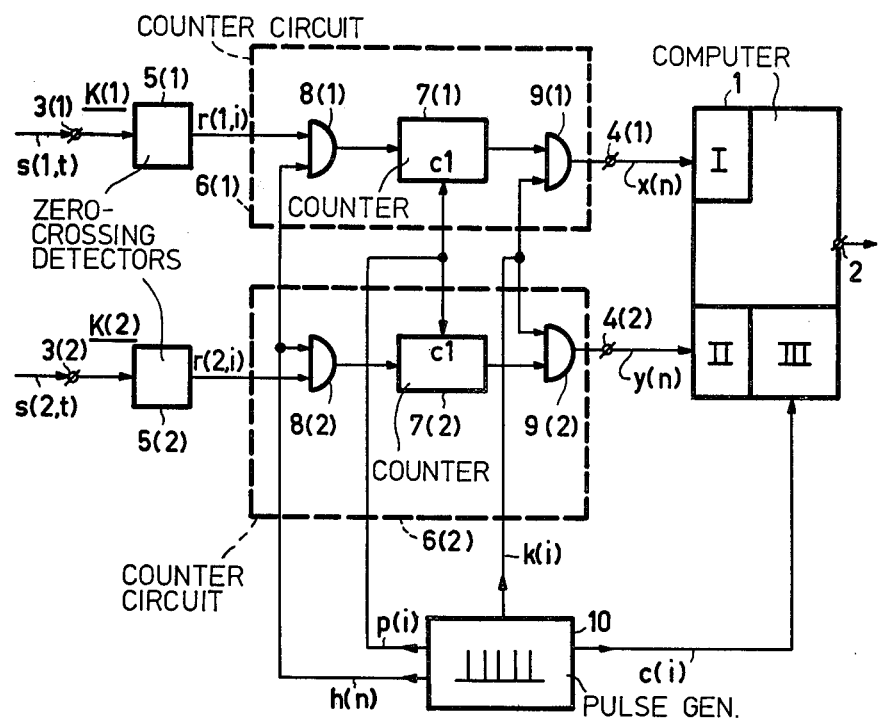
FIG. 1 shows a first embodiment of the signal comparison circuit in which two separated signal processing channels are used.

FIG. 1 shows a first embodiment of the signal comparison circuit, which includes a clock pulse $c(i)$ - controlled programmable computer 1 to which the N numbers $x(n)$ and the N numbers $y(n)$, wherein $n = 1, 2, \ldots, N$, are applied. This computer 1 is of the type having a first memory field I and a second memory field II, as well as a third memory field III. The N numbers $x(n)$ are stored in the first memory field I and the numbers $y(n)$ in the second memory field II. The third memory field is used to store the program therein. Preferably, this program contains the instructions which are required to compute the value of the correlation coefficient R by means of the N numbers $x(n)$ and the N numbers $y(n)$ and to compare this correlation coefficient with a threshold value. This computer has an output 2 at which a logic "0" appears as long as the computed correlation coefficient R is smaller than the threshold The numbers $x(n)$ and $y(n)$ are produced by a first and a second signal processing channel $K(1)$ and $K(2)$, respectively. This signal processing channel $K(.)$ has an input $3(.)$ and an output $4(.)$. A cascade arrangement of a zero-crossing detector $5(.)$ and a counter circuit $6(.)$ is included between this input $3(.)$ and this output $4(.)$. An analog signal $s(.,t)$, which is converted by the zero-crossing detector into a pulse train $r(.,i)$ is applied to this signal processing channel $K(.)$. Each pulse in this pulse train marks the location of a zero-crossing in $s(.,t)$. This pulse train $r(.,i)$ is applied to the counter circuit $6(.)$, which counts those pulses of $r(.,t)$ which occur within a measuring time interval of a sequence of N consecutive measuring time intervals $T(1), T(2), T(3), \ldots T(N)$. The number of pulses of $r(1, i)$ occurring within the measuring time interval $T(n)$ has already been denoted $x(n)$ in the foregoing. In a corresponding manner the quantity $y(n)$ now represents the number of pulses of $r(2, i)$ occurring within the same measuring time interval $T(n)$. These measuring time intervals $T(n)$ may all be of equal duration, but they may alternatively have mutually different lengths.

In order to carry out this counting operation in the above-described manner the counter circuit $6(.)$ includes a counter $7(.)$ to which the pulses of the pulse train $r(.,i)$ are applied through an AND-gate $8(.)$. This AND-gate $8(.)$ also receives periodically a sequence consisting of N gate pulses $h(1), h(2), \ldots h(N)$, the pulse duration of the gate pulse $h(n)$ being equal to the length of the measuring time interval $T(n)$.

As it is only of interest to know how many pulses of $r(.,i)$ occur in the individual measuring time intervals $T(1), T(2), \ldots T(N)$, the counting position of the counter $7(.)$, which represents the number $x(n)$ or $y(n)$ is each time transferred, at an instant located between these two consecutive gate pulses, to the computer 1 and this computer is thereafter reset to the zero position.

For the transfer of the counting position to the computer the output of the counter 7(.) is connected through an AND-gate 9(.) to the output 4(.) of the signal processing channel K(.). Transfer pulses k(i) (i=0, 1, 2, ... α) are applied to this AND-gate 9(.). The counter 7(.) has a clear input C1 to wich clear pulses p(i) are applied to adjust it to the zero position.

FIG. 1 shows that the pulses required for the control of this signal comparison circuit are generated by a pulse generator 10.

Figure 2:
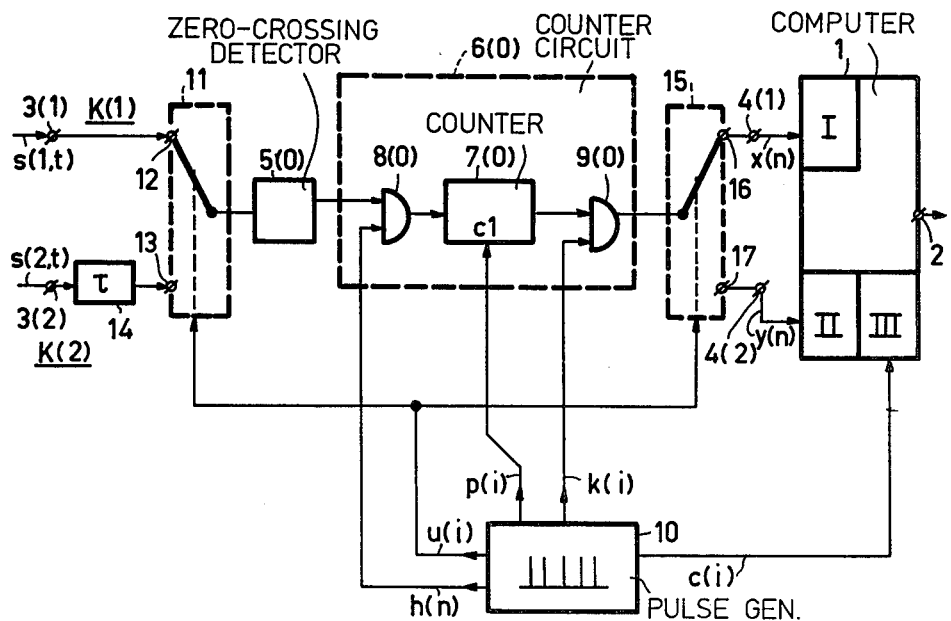
FIG. 2 shows a second embodiment of the signal comparison circuit in which the two signal processing circuits have a number of elements in common.

FIG. 2 shows a second embodiment of the signal comparison circuit. Also this circuit includes two signal processing channels K(1) and K(2), each having an input 3(1) and 3(2), respectively and an output 4(1) and 4(2), respectively, as well as a cascade arrangement of a zero-crossing detector 5(0) and a counter circuit 6(0). This counter circuit 6(0) is of a similar implementation as the counter circuits 6(1) and 6(2) which are used in the embodiment of FIG. 1, and includes a cascade arrangement of an AND-gate 8(0), a counter 7(0) and an AND-gate 9(0). This embodiment differs from the embodiment shown in FIG. 1 in that the cascade arrangement of the zero-crossing detector 5(0) and the counter circuit 6(0) is now common to both signal processing channels K(1) and K(2) and is alternately used in time-division multiplex to generate the N-numbers x(n) in response to the first analog signal s(1,t) and to generate the N numbers y(n) in response to the second analog signal s(2,t).

In order to use the said cascade arrangement in the time-division multiplex mode there is connected to the input of the zero-crossing detector 5(0) the output of a two-position switch 11, which is shown symbolically only, and which has the two inputs 12 and 13. The input 12 is connected to the input 3(1) of the signal processing circuit K(1). In this embodiment the input 13 is connected to the input 3(2) of the signal processing channel K(2), through a delay line 14. This delay line 14 has a time delay $\tau$ which is equal to the time interval between the leading edges of two consecutive gate pulses h(n) and h(n+1) which are applied to the AND-gate 8(0). In addition, also the output of the counter circuit 6(0) is connected to the input of a two-position switch 15, which is shown symbolically only and has the two outputs 16 and 17. Output 16 is connected to the input 4(1) of the signal processing channel K(1) and the output 17 is connected to the output 4(2) of the signal processing channel K(2).

The switches 11 and 15 are controlled by control pulses u(i) which are also produced by the pulse generator 10. This control is such that alternately input 12 and input 13 of switch 11 and output 16 and output 17 of switch 15 are connected for a period of time $\tau$ to the input of the zero-crossing detector 5(0) and to the output of the counter circuit 6(0), respectively.

It should be noted that in the embodiment of FIG. 2 the consecutive measuring time intervals will have to be mutually equal.

It should also be noted that the measuring time intervals are permitted to partly overlap.

What is claimed is:

1. A signal comparison circuit for comparing a first and a second analog signal with each other, characterized by:
   (a) a first and a second signal processing channel each having:
      i—an input port to which one or other of said analog signals are applied,
      ii—an output port;
      iii—a zero-crossing detector the input of which is coupled to the input of the signal processing channel;
      iv—a counter circuit the input of which is connected to the output of the zero-crossing detector and the output of which is coupled to the output of the signal processing channel and which is arranged to count all the zero-crossings occurring within a measuring time interval T(n) wherein n=1, 2, 3, ... N of a number of N measuring time intervals T(1), T(2), ... T(N) and for producing a number which indicates the number of zero-crossings which occurred in this measuring time interval T(n);
   (b) a computer which is coupled to the two output ports of the two signal processing channels and is arranged to:
      i—receive the N numbers produced by the counter circuit in the first signal processing channel and the N numbers produced by the counter circuit in the second signal processing channel;
      ii—determine by means of these numbers the value of a statistical quantity;
      iii—produce a first and a second signal, respectively, when the value of this statistical quantity is higher than, respectively lower than or equal to a threshold value.

2. A signal comparison circuit as claimed in claim 1, characterized in that the statistical quantity is formed by the directional coefficient of a straight line which is closest to the numbers produced by the counter circuit in the first signal processing channel.

3. A signal processing circuit as claimed in claim 1, characterized in that the statistical quantity is formed by the correlation coefficient.

4. A signal comparison circuit as claimed in claim 1, characterized in that the statistical quantity is formed by the directional coefficient of a straight line which is closest to the numbers produced by the counter circuit in the second signal processing channel.

* * * * *